United States Patent [19]
Anderson

[11] Patent Number: 5,963,087
[45] Date of Patent: Oct. 5, 1999

[54] GAIN CONTROL CIRCUIT AND METHOD FOR PROVIDING GAIN CONTROL OF A VARIABLE AMPLIFIER USING A PILOT SIGNAL

[75] Inventor: Mark Brian Anderson, Algonquin, Ill.

[73] Assignee: Motorola, Inc., Schaumburg, Ill.

[21] Appl. No.: 09/087,172

[22] Filed: May 29, 1998

[51] Int. Cl.$^6$ ................................ H03F 3/66; H03G 3/20
[52] U.S. Cl. ........................ 330/52; 330/136; 330/137
[58] Field of Search ........................ 330/52, 129, 132, 330/136, 137, 140, 284; 455/237.1

[56] References Cited

U.S. PATENT DOCUMENTS

| | | | |
|---|---|---|---|
| 2,974,224 | 3/1961 | Ule | 455/237.1 |
| 3,378,786 | 4/1968 | Andrea | 455/237.1 X |
| 5,617,240 | 4/1997 | Hergault et al. | 359/194 |

FOREIGN PATENT DOCUMENTS

| | | | |
|---|---|---|---|
| 0028637 | 2/1980 | Japan | 330/52 |
| 0260809 | 10/1990 | Japan | 330/136 |
| 3273705 | 12/1991 | Japan | 330/136 |

*Primary Examiner*—Steven J. Mottola
*Attorney, Agent, or Firm*—John B. MacIntyre

[57] ABSTRACT

The present invention provides for a gain control circuit (10) and method for providing gain control of a variable amplification circuit (16) using a pilot signal. A pilot signal is added to the received signal. The pilot signal has at least a minimum signal level which when added to the signal received insures the sampled input signal has a level above the point where offset or low power errors are experienced. Preferably the pilot signal will be a sinusoidal signal having a frequency within the operational bandwidth of the amplifier (16), but outside the frequency range of the input signal.

16 Claims, 1 Drawing Sheet

GAIN CONTROL CIRCUIT AND METHOD FOR PROVIDING GAIN CONTROL OF A VARIABLE AMPLIFIER USING A PILOT SIGNAL

FIELD OF THE INVENTION

The present invention relates generally to gain control circuits, and more specifically to a gain control circuit using a pilot signal for expanding the dynamic range of the gain control circuit.

BACKGROUND OF THE INVENTION

Gain control circuits have been used for controlling the level of gain applied to a received signal or a signal to be transmitted. In many instances it is desirable to maintain a consistent signal level, over different operating conditions. For example in a cellular communication environment, it is desirable to transmit a signal having a signal level sufficient for being received at all locations within a cell, but not so strong as to cause interference in nearby cells. Often times the optimum signal level is determined by the size of the cell or the physical location of the communication antenna within the cell.

Gain control, rather than output power control, is needed if the total transmitted signal contains multiple voice traffic channels which are selectively enabled, causing the composite signal power to vary. Gain control will keep the level of each individual voice channel constant when the channel is enabled, while allowing variation of the composite signal level. Gain can also vary dependent upon other factors such as variations in signal frequency, temperature, and input signal levels, and therefore gain control circuits have been used to account for changes of these types.

Typically a gain control circuit will measure the operational signal levels by sampling the signal levels at the input and the output. In many RF amplifiers this is performed by using Schottky diodes. Unfortunately these diodes do not function reliably below certain power levels, because temperature compensation becomes more difficult and voltage levels become too low to overcome offset voltages and noise in the associated circuitry.

When very low signal levels or no signal levels are detected, inherent voltage errors in the control circuitry, which can result from detector bias drift, op amp offset voltages and currents, etc., becomes a significant component of the signals used to determine the value of the control signal. This causes the gain to drift to levels not fully reflective of the actual signal levels. At these signal levels the gain control circuit is ineffective for providing the necessary gain adjustments, resulting in a reduced dynamic range.

When no signal is detected or no signal is present, the inherent error voltages in the control circuitry will cause the gain of the amplifier to drift, often times adjusting to its maximum level. Subsequently when the input signal reaches a level no longer dominated by the error voltages, the signal will be initially amplified a maximum amount, until the control loop stabilizes the gain, which can cause the generation of a signal to be transmitted having a signal level which exceeds acceptable operating levels. This could result in interference, as well as damage to the present or subsequent amplifier stages. Therefore a gain control circuit having an expanded dynamic range over which the gain is stable would be beneficial.

DETAILED DESCRIPTION OF THE PREFERRED EMBODIMENT

The present invention provides for a gain control circuit wherein a pilot signal having a minimum signal level is added to the input signal, in order to insure that the signal level of the input signal is prevented from falling below a signal level where errors are more likely experienced.

Stated more specifically a gain control circuit is provided comprising a received signal input for receiving an input signal to be amplified, a pilot signal injector coupled to said received signal input for adding a pilot signal to the input signal, and a variable amplification circuit coupled to said pilot signal injector for receiving the input signal with pilot signal added and producing an amplified output signal, and having a control input. The level of amplification is dependent upon the value of the signal received at the control input. The gain control circuit further comprises an input sampling circuit coupled to said pilot signal injector for sampling the input signal with pilot signal added, an output sampling circuit coupled to said variable amplification circuit for sampling the amplified output signal, and a control loop for receiving the sampled input signal with pilot signal added and the sampled amplified output signal, for producing a control signal coupled to the control input of the variable amplification circuit.

Furthermore a method is provided for providing gain control of a variable amplifier using a pilot signal. The method comprises the steps of receiving an input signal, adding a pilot signal to the input signal, and amplifying the input signal with pilot signal added a variable amount, for producing an amplified output signal. The method then provides for sampling the input signal with pilot signal added, sampling the amplified output signal, and comparing the sampled input signal with pilot signal added to the sampled amplified output signal, wherein the sampled input signal with pilot signal added is comprised primarily of the pilot signal portion of the sampled input signal with pilot signal, when the received portion of the signal level of the sampled input signal with pilot signal added falls below a predetermined threshold. The method then adjusts the variable amount of amplification in the step of amplifying the input signal with pilot signal added, based on the result of the comparison between the sampled input signal with pilot signal added and the sampled amplified output signal.

Figure 1:
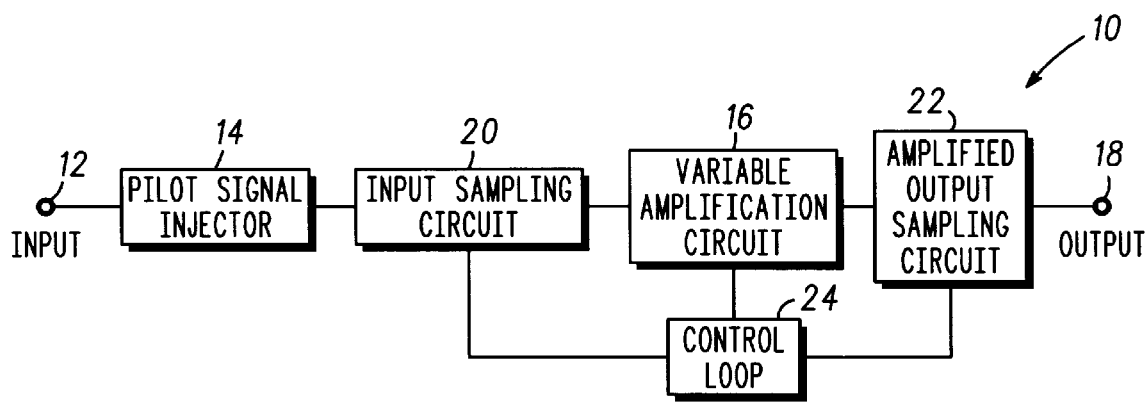
FIG. 1 is a block diagram generally depicting a gain control circuit using a pilot signal, in accordance with the present invention.

Referring now to the drawings in greater detail, there is generally depicted in FIG. 1 a block diagram of a gain control circuit 10 using a pilot signal, in accordance with the present invention. The circuit shown in FIG. 1 provides for a received signal input 12 for receiving a signal to be amplified. The received signal input is coupled to a pilot signal injector 14, wherein a pilot signal is added to the received signal. The pilot signal injector is coupled to a variable amplification circuit 16, which receives the input signal with pilot signal added and produces an amplified output signal coupled to an output terminal 18.

Coupled between the pilot signal injector 14 and the variable amplification circuit 16 is an input sampling circuit 20 for sampling a signal representative of the input signal with pilot signal added. Coupled between the variable amplification circuit 16 and the output terminal 18 is an amplified output sampling circuit 22 for sampling a signal representative of the amplified output signal. The input sampling circuit 20 and amplified output sampling circuit 22 are coupled to a control loop 24, which receives the sampled signals and produces a control signal coupled to the variable amplification circuit 16 for adjusting the level of amplification of the variable amplification circuit 16.

Figure 2:
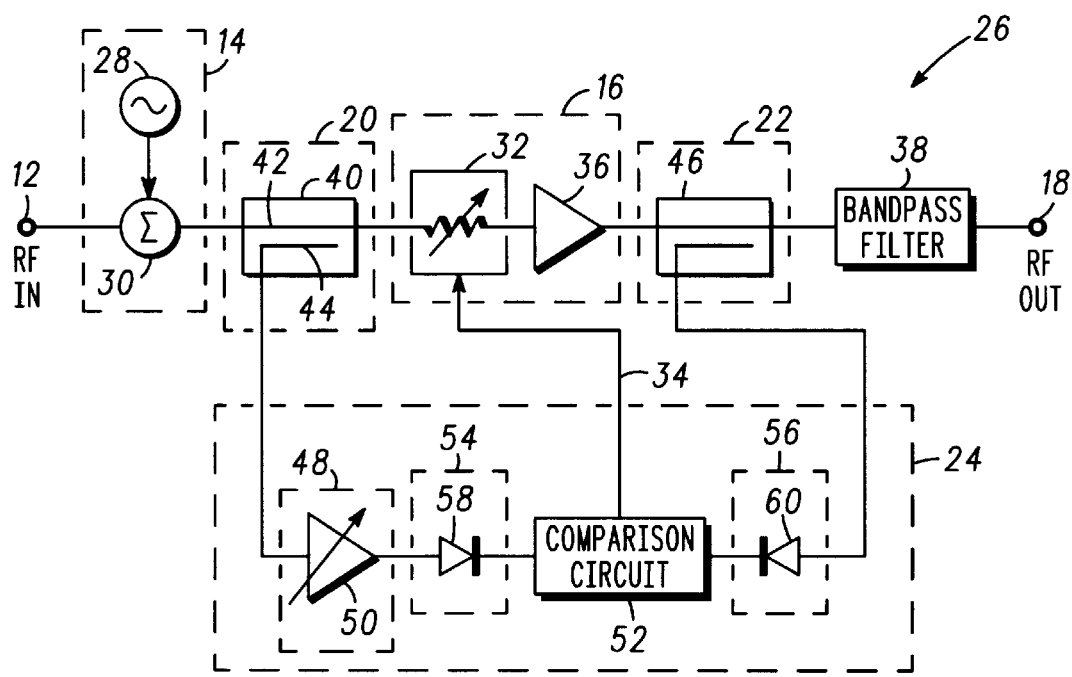
FIG. 2 is a more detailed block diagram of the gain control circuit, shown in FIG. 1.

FIG. 2, is a more detailed block diagram of a gain control circuit 26, corresponding to the gain control circuit 10 shown in FIG. 1. The gain control circuit 26, similarly includes a received signal input 12 for receiving an input signal. In the preferred embodiment, wherein the circuit 26 is used within a cellular communication system, the input signal has an operating frequency, typically, in the radio frequency spectrum.

The received signal input 12 is coupled to the pilot signal injector 14. The pilot signal injector includes an oscillator 28 for generating a pilot signal coupled to an adder 30 for adding the generated pilot signal to the input signal. The oscillator preferably produces a sinusoidal AC signal at a frequency that is not used by the main RF signal, but is within the operational frequency of the variable amplification circuit 16. Similarly a frequency for the pilot signal should be selected, which does not generate any significant noise signals at associated harmonic frequencies, corresponding to the frequencies that are used by the received input signal. This allows the pilot signal to remain separate from the input signal in the frequency domain in order for the portion of the output signal associated with the pilot signal to be more easily filtered from the amplified output signal.

Furthermore the signal level of the pilot signal is selected so as to maintain a certain minimum signal level above a predetermined threshold, at least high enough to ensure proper operation of the control loop 24 and avoid problems associated with an input signal which is too low. With the pilot signal added to the input signal even if the signal level of the input signal component falls below the predetermined threshold, the pilot signal component prevents the overall signal level from falling below a minimum signal level where the errors are likely to occur.

The input signal with pilot signal added is coupled to the variable amplification circuit 16, via input sampling circuit 20 for producing an amplified output signal. The variable amplification circuit 16 includes a variable attenuator 32, having a control input 34, coupled to an amplifier stage 36. The overall gain of the variable amplification circuit 16 is the sum of the gain associated with the variable attenuator 32 and the gain associated with the amplifier stage 36. This allows the overall gain of the variable amplification circuit 16 to be adjusted by controlling the gain of the variable attenuator 32, via the control input 34.

The amplified output signal is coupled to a bandpass filter 38, via amplified output sampling circuit 22, for removing the component of the amplified output signal associated with the pilot signal and passing the filtered signal to the output terminal 18.

The input sampling circuit 20 includes a coupler 40, for generating a sampled input signal proportional to the input signal with pilot signal added. The coupler includes a primary conductor path 42 and a secondary conductor path 44. The sampled input signal is generated by the current induced in the secondary conductor path 44 from the electromagnetic field generated by the current in the primary conductor path 42. Similarly the amplified output circuit 22 includes a coupler 46, and produces a sampled amplified output signal proportional to the amplified output signal. The sampled input signal and the sampled amplified output signal are coupled to the control loop 24, wherein they are used for producing a control signal.

The control loop 24 receives the sampled input signal and couples it to the input of a reference amplification level adjustment circuit 48 for producing a reference amplification level signal. In the preferred embodiment the reference amplification level adjustment circuit 48 is a variable amplifier 50. The reference amplification level signal and the sampled amplified output signal are respectively coupled to a comparison circuit 52, via corresponding RF detectors 54 and 56.

In the preferred embodiment, the RF detectors 54 and 56 are diodes 58 and 60, which rectify the reference amplification level signal and the sampled amplified output signal to produce DC voltages proportional to the corresponding signals.

The comparison circuit compares the two rectified signals, and generates a control signal, which is coupled to the control input 34 of the variable amplification circuit 16. Because the reference amplification level signal is dependent upon the gain of the variable amplifier 50, by adjusting the gain of the variable amplifier 50 the overall gain of variable amplification circuit 16 can be correspondingly set.

The use of a pilot signal as provided for by the present invention allows for the rectified signals compared to largely correspond to the signal levels associated with the received input signal, when the signal level of the received input signal is above the signal level of the pilot signal. However when the signal level of the received input signal falls below the signal level of the pilot signal, the rectified signals compared largely corresponds to the signal levels associated with the pilot signal. This insures the presence of sampled signals having a signal level high enough to be properly detected and avoid being significantly affected by error voltages, with at least one benefit being that of a gain control circuit having an expanded dynamic range.

From the foregoing description, it will be apparent that the gain control circuit and method for providing gain control of a variable amplifier using a pilot signal of the present invention has a number of advantages, some of which have been described above and others of which are inherent in the invention. Also it will be understood that modifications can be made to the circuit and method described above without departing from the teachings of the invention.

I claim:

1. A gain control circuit comprising:
    a received signal input for receiving an input signal to be amplified;
    a pilot signal injector coupled to said received signal input for adding a pilot signal to the input signal;
    a variable amplification circuit coupled to said pilot signal injector for receiving the input signal with pilot signal added and producing an amplified output signal, and having a control input, the level of amplification dependent upon the value of the signal received at the control input;
    an input sampling circuit coupled to said pilot signal injector for sampling the input signal with pilot signal added;
    an output sampling circuit coupled to said variable amplification circuit for sampling the amplified output signal; and
    a control loop for receiving the sampled input signal with pilot signal added and the sampled amplified output signal, for producing a control signal coupled to the control input of the variable amplification circuit.

2. The gain control circuit of claim 1, wherein said pilot signal injector includes an oscillator, for generating said pilot signal and an adder coupled to said oscillator and to said received signal input for producing the input signal with pilot signal added.

3. The gain control circuit of claim 2, wherein said pilot signal is a sinusoidal AC signal.

4. The gain control circuit of claim 3, wherein the frequency of said sinusoidal pilot signal is within the operational frequency range of said variable amplification circuit, but outside the frequency range of the input signal.

5. The gain control circuit of claim 1, further comprising an output filter coupled to the variable amplification circuit for filtering the portion of the amplified output signal corresponding to the pilot signal from the amplified output signal.

6. The gain control circuit of claim 1, wherein said input sampling circuit comprises a coupler.

7. The gain control circuit of claim 1, wherein said output sampling circuit comprises a coupler.

8. The gain control circuit of claim 1, wherein said control loop includes a reference amplification level adjustment circuit for receiving the sampled input signal with pilot signal added and producing a reference amplification level signal.

9. The gain control circuit of claim 8, wherein said reference amplification level adjustment circuit comprises a variable amplifier.

10. The gain control circuit of claim 8, wherein said control loop includes a comparison circuit coupled to said reference amplification level adjustment circuit and said output sampling circuit for receiving the reference amplification level signal and the sampled amplified output signal, respectively, and for producing a control signal coupled to the control input of said variable amplification circuit.

11. The gain control circuit of claim 10, wherein said comparison circuit is coupled to said variable amplifier and said output sampling circuit, via corresponding RF detectors.

12. The gain control circuit of claim 11, wherein said RF detectors are diodes.

13. The gain control circuit of claim 1, wherein said variable amplifier circuit includes a variable attenuator coupled to said control input for receiving said control signal, and an amplifier stage coupled to said variable attenuator.

14. A method for providing gain control of a variable amplifier using a pilot signal comprising the steps of:
  receiving an input signal;
  adding a pilot signal to the input signal;
  amplifying the input signal with pilot signal added a variable amount, for producing an amplified output signal;
  sampling the input signal with pilot signal added;
  sampling the amplified output signal;
  comparing the sampled input signal with pilot signal added to the sampled amplified output signal, wherein the sampled input signal with pilot signal added is comprised primarily of the pilot signal portion of the sampled input signal with pilot signal, when the received portion of the signal level of the sampled input signal with pilot signal added falls below a predetermined threshold; and
  adjusting the variable amount of amplification in the step of amplifying the input signal with pilot signal added, based on the result of the comparison between the sampled input signal with pilot signal added and the sampled amplified output signal.

15. The method of claim 14, further comprising prior to the step of adding a pilot signal to the input signal, the step of generating a pilot signal having a frequency within the operational range of said variable amplifier, but outside the frequency range of said input signal.

16. The method of claim 14, further comprising after the step of amplifying the input signal with pilot signal added a variable amount, the step of filtering the amplified output signal, for removing the pilot signal portion of the amplified output signal.

* * * * *